(12) United States Patent
Namiki et al.

(10) Patent No.: US 11,965,111 B2
(45) Date of Patent: Apr. 23, 2024

(54) SURFACE TREATMENT AGENT AND SURFACE TREATMENT METHOD

(71) Applicant: TOKYO OHKA KOGYO CO., LTD., Kawasaki (JP)

(72) Inventors: Takumi Namiki, Kawasaki (JP); Emi Uchida, Kawasaki (JP); Mai Sugawara, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 658 days.

(21) Appl. No.: 16/552,345

(22) Filed: Aug. 27, 2019

(65) Prior Publication Data
US 2020/0079962 A1   Mar. 12, 2020

(30) Foreign Application Priority Data

Sep. 11, 2018  (JP) ................. 2018-169610

(51) Int. Cl.
| | | |
|---|---|---|
| *C09D 5/00* | (2006.01) | |
| *C08K 5/16* | (2006.01) | |
| *C08K 5/34* | (2006.01) | |
| *C08K 5/54* | (2006.01) | |
| *H01L 21/30* | (2006.01) | |

(52) U.S. Cl.
CPC ................. *C09D 5/00* (2013.01); *C08K 5/16* (2013.01); *C08K 5/34* (2013.01); *C08K 5/54* (2013.01); *H01L 21/30* (2013.01)

(58) Field of Classification Search
CPC ... C09D 5/00; C08K 5/16; C08K 5/34; C08K 5/54; H01L 21/30
USPC .................................................... 106/287.11
See application file for complete search history.

(56) References Cited

U.S. PATENT DOCUMENTS

| | | | | |
|---|---|---|---|---|
| 2011/0073011 A1* | 3/2011 | Yoshida | .................. | C09D 7/20 106/287.11 |
| 2011/0132397 A1* | 6/2011 | Kumon | ............... | C11D 11/0047 134/115 R |
| 2013/0056023 A1 | 3/2013 | Kumon et al. | | |
| 2013/0206039 A1* | 8/2013 | Ohhashi | ................ | G03F 7/0752 106/287.11 |
| 2016/0185595 A1* | 6/2016 | Chen | ..................... | C09K 13/10 252/79.3 |
| 2017/0088722 A1* | 3/2017 | Mori | ....................... | G03F 7/405 |
| 2017/0287705 A1 | 10/2017 | Saio et al. | | |

FOREIGN PATENT DOCUMENTS

| | | |
|---|---|---|
| JP | 11-511900 A | 10/1999 |
| JP | 2010-192879 A | 9/2010 |
| JP | 2012-033873 A | 2/2012 |
| JP | 2016-066785 A | 4/2016 |
| JP | 2017-063179 A | 3/2017 |
| KR | 10-2017-0036616 | 4/2017 |
| WO | WO 96/15861 A1 | 5/1996 |

OTHER PUBLICATIONS

Office Action issued in Japanese Patent Application No. 2018-169610, dated Mar. 28, 2022.

* cited by examiner

*Primary Examiner* — Doris L Lee

(74) *Attorney, Agent, or Firm* — Knobbe, Martens, Olson & Bear, LLP

(57) ABSTRACT

A surface treatment agent containing a silylating agent (A) and a compound (C) having an amide skeleton in a molecule, and a surface treatment method for subjecting an object to be treated to surface treatment using the surface treatment agent.

2 Claims, No Drawings

SURFACE TREATMENT AGENT AND SURFACE TREATMENT METHOD

BACKGROUND OF THE INVENTION

Field of the Invention

The present invention relates to a surface treatment agent and a surface treatment method.

Priority is claimed on Japanese Patent Application No. 2018-169610, filed on Sep. 11, 2018, the entire content of which is incorporated herein by reference.

Description of Related Art

In recent years, tendencies of high integration and miniaturization of a semiconductor device have increased, and microfabrication and achievement of a high aspect ratio of an inorganic pattern on a substrate are in progress. On the other hand, a problem of so-called pattern collapse may arise. This pattern collapse is a phenomenon in which when forming a number of inorganic patterns in parallel on a substrate, adjacent patterns are brought close to each other such that they lean on each other, which causes breakage or separation of the patterns from a base portion in some cases. Such pattern collapse causes a decrease in the product yield and reliability.

It is known that this pattern collapse occurs due to surface tension of a washing liquid when the washing liquid dries in washing treatment after the pattern formation. That is, when the washing liquid is removed in the drying process, a stress acts between the patterns based on the surface tension of the washing liquid to cause pattern collapse.

From such a background, application of drug solutions for forming a protective film as disclosed in Japanese Unexamined Patent Application, First Publication No. 2016-66785 and Japanese Unexamined Patent Application, First Publication No. 2012-033873 has been proposed. According to the drug solutions disclosed in the literature, it is possible to impart water repellency to the surface of a concave-convex pattern. As a result, it is supposed that the pattern collapse can be suppressed.

Although different from the pattern collapse, water repellency (silylation) is imparted to the surface of a substrate using a silylating agent such as hexamethyldisilazane (HMDS) (for example, refer to [Background of the Invention] of Published Japanese Translation No. H11-511900 of the PCT International Publication) in order to prevent partial loss of a resin pattern due to a developer by improving adhesiveness between the resin pattern, which becomes an etching mask, and the substrate.

SUMMARY OF THE INVENTION

The surface treatment agent for subjecting the surface of an object to be treated such as a semiconductor substrate to a water repellency treatment is required to have stable quality and excellent usability.

The present invention has been made in consideration of the above-described circumstances, and an object of the present invention is to provide a surface treatment agent having stable quality.

In order to achieve the above-mentioned object, the present invention adopted the following constitution.

According to a first aspect of the present invention, there is provided a surface treatment agent containing: a silylating agent (A); and a compound (C) having an amide skeleton in a molecule.

According to a second aspect of the present invention, there is provided a surface treatment method including: subjecting an object to be treated to surface treatment using the surface treatment agent.

According to the present invention, it is possible to provide a surface treatment agent having stable quality.

DETAILED DESCRIPTION OF THE INVENTION

Surface Treatment Agent

A surface treatment agent according to the present embodiment contains: a silylating agent (A); and a compound (C) having an amide skeleton in a molecule.

Examples of the "object to be treated" to be subjected to surface treatment include a substrate used for producing a semiconductor device. Examples thereof include a silicon (Si) substrate, a silicon nitride (SiN) substrate, a silicon oxide film (Ox) substrate, a tungsten (W) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a ruthenium (Ru) substrate, and a copper (Cu) substrate.

Examples of the "surface of a substrate" include the surface of a substrate itself, the surface of an inorganic pattern provided on a substrate, and the surface of an unpatterned inorganic layer.

Taking a silicon (Si) substrate as an example, a silicon oxide film such as a natural oxide film, a thermal oxide film, and a vapor-phase synthetic film (such as a CVD film) may be formed on the surface of the substrate, or a pattern may be formed on the silicon oxide film.

A pattern may be provided on the surface of the object to be treated in the present embodiment.

The shape of the pattern is not particularly limited, and can be, for example, a pattern shape generally formed in a semiconductor manufacturing process. The pattern shape may be a line pattern, a hole pattern, or a pattern including a plurality of pillars. The pattern shape is preferably a pattern including a plurality of pillars. The shape of a pillar is not particularly limited, but examples thereof include a cylindrical shape and a polygonal prism shape (such as a square prism shape).

Silylating Agent (A)

The silylating agent (A) (hereinafter, also referred to as a "component (A)") is a component for silylating the surface of an object to be treated (for example, a semiconductor substrate) to improve the water repellency of the surface of the object to be treated (for example, a semiconductor substrate).

The component (A) in the present embodiment is not particularly limited, but it is possible to use any silylating agents well-known in the related art. Examples of the component (A) include the following components (A1) to (A3).

Component (A1): alkoxy monosilane compound having hydrophobic group binding to silicon atom Component (A2): compound having hydrophobic group binding to silicon atom and leaving group binding to silicon atom Component (A3): cyclic silazane compound

Component (A1)

The component (A1) is an alkoxy monosilane compound having a hydrophobic group binding to a silicon atom.

The alkoxy monosilane compound having a hydrophobic group binding to a silicon atom means a compound which has one silicon atom, has at least one hydrophobic group binding to the above-described silicon atom, and has at least one alkoxy group binding to the above-described silicon atom.

In a case of using the alkoxy monosilane compound having a hydrophobic group binding to a silicon atom as the silylating agent (A), it is possible to make the alkoxy monosilane compound having a hydrophobic group bind to the surface of an object to be treated. In a case where the alkoxy monosilane compound binds to an object to be treated, it is possible to form a monolayer, derived from the alkoxy monosilane compound, on the surface of the object to be treated. The monolayer is preferably a self-assembled monolayer (SAM) in which a network of siloxane bonds is formed on the surface of the object to be treated in a surface direction. The monolayer and the self-assembled monolayer will be described in detail below.

As the above-described hydrophobic group included in the above-described alkoxy monosilane compound, a chain aliphatic hydrocarbon group having 3 to 20 carbon atoms is preferable, a chain aliphatic hydrocarbon group having 6 to 18 carbon atoms is more preferable, a chain aliphatic hydrocarbon group having 7 to 12 carbon atoms is still more preferable, a chain aliphatic hydrocarbon group having 8 to 11 carbon atoms is particularly preferable, and a chain aliphatic hydrocarbon group having 8 to 10 carbon atoms is most preferable from the viewpoint of improving hydrophobicity.

The above-described chain aliphatic hydrocarbon group may be a group in which a part or all of hydrogen atoms may be substituted with a halogen atom (such as a fluorine atom) or may be linear or branched. However, the chain aliphatic hydrocarbon group is preferably a linear aliphatic hydrocarbon group in which a part or all of hydrogen atoms may be substituted with a fluorine atom.

An alkoxy group included in the above-described alkoxy monosilane compound is represented by General Formula of RO- (R represents an alkoxy group). As the alkoxy group represented by R, a linear or branched alkyl group is preferable and a linear alkyl group is more preferable. In addition, the number of carbon atoms of the alkyl group represented by R is not particularly limited, but is preferably 1 to 10, more preferably 1 to 5, and still more preferably 1 or 2 from the viewpoint of controlling particularly during hydrolysis or condensation. Specific examples of the alkoxy group included in the alkoxy monosilane compound include a methoxy group, an ethoxy group, a propoxy group, an isopropoxy group, a butoxy group, a sec-butoxy group, and a t-butoxy group.

The above-described alkoxy monosilane compound is preferably a compound represented by Formula (1).

$$R^1{}_nSiX_{4-n} \quad (1)$$

[In the general formula, $R^1$'s each independently represents a monovalent organic group; at least one of $R^1$'s is a chain aliphatic hydrocarbon group having 3 to 20 carbon atoms in which a part or all of hydrogen atoms may be substituted with a fluorine atom; X is an alkoxy group; and n is an integer of 1 to 3.]

Examples of the monovalent organic group relating to $R^1$ include an alkyl group, an aromatic hydrocarbon group, an amino group, a monoalkylamino group, and a dialkylamino group.

Hereinafter, a case where $R^1$ is an organic group other than the chain aliphatic hydrocarbon group having 3 to 20 carbon atoms in which a part or all of hydrogen atoms may be substituted with a fluorine atom will be described.

As the alkyl group, a linear or branched alkyl group having 1 to 20 carbon atoms (preferably 1 to 8 carbon atoms) is preferable, and a methyl group, an ethyl group, an n-propyl group, and an isopropyl group are more preferable.

As the aromatic hydrocarbon group, a phenyl group, a naphthyl group, a biphenylyl group, an anthryl group, and a phenanthrenyl group are preferable, a phenyl group and a naphthyl group are more preferable, and a phenyl group is particularly preferable.

The alkyl group contained in the monoalkylamino group or dialkylamino group may contain a nitrogen atom, an oxygen atom, or a carbonyl group in a chain, or may be a linear alkyl group or a branched alkyl group. The number of carbon atoms of the alkyl group contained in the monoalkylamino group or the dialkylamino group is not particularly limited, but is preferably 1 to 20, more preferably 1 to 10, and particularly preferably 1 to 6.

Next, a case where $R^1$ is a chain aliphatic hydrocarbon group having 3 to 20 carbon atoms in which a part or all of hydrogen atoms may be substituted with a fluorine atom will be described.

As described above, the number of carbon atoms of the chain aliphatic hydrocarbon group is more preferably 6 to 18, still more preferably 7 to 12, particularly preferably 8 to 11, and most preferably 8 to 10.

The chain aliphatic hydrocarbon group may be linear or branched, and is preferably linear.

Suitable examples of the chain aliphatic hydrocarbon group in which a part or all of hydrogen atoms may be substituted with a fluorine atom include linear alkyl groups such as an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, and an n-octadecyl group, and a fluorinated linear alkyl group in which a hydrogen atom on each of the linear alkyl groups is substituted with fluorine.

An alkoxy group having 1 to 5 carbon atoms is preferable as X. Specific examples of X include alkoxy groups such as a methoxy group, an ethoxy group, an n-propoxy group, an isopropoxy group, an n-butoxy group, a sec-butoxy group, and a t-butoxy group.

Among these, a methoxy group, an ethoxy group, an isopropoxy group, or a butoxy group is preferable from the viewpoint of controlling particularly during hydrolysis or condensation.

In addition, the above-described alkoxy monosilane compound is preferably a trialkoxy monosilane compound.

The alkoxy monosilane compound exemplified above can be used alone or in combination of two or more thereof.

Specific examples of such an alkoxy monosilane compound include propyltrimethoxysilane, 3,3,3-trifluoropropyltrimethoxysilane, n-hexyltrimethoxysilane, n-octyltrimethoxysilane, n-dodecyltrimethoxysilane, and n-octadecyltrimethoxysilane, and n-hexyltrimethoxysilane, n-octyltrimethoxysilane, n-dodecyltrimethoxysilane, or n-octadecyltrimethoxysilane is preferable and n-octyltrimethoxysilane, n-dodecyltrimethoxysilane, or n-octadecyltrimethoxysilane is more preferable.

A monolayer can be formed on the surface of an object to be treated using the above-described alkoxy monosilane compound. In a case where a monolayer derived from an alkoxy monosilane compound having a hydrophobic group is formed on the surface of an object to be treated, the hydrophobicity of the surface of the object to be treated can be improved at a high level.

A network of siloxane bonds is preferably formed on the surface of the object to be treated in a surface direction in the monolayer from the viewpoint of particularly improving hydrophobicity at a high level. The monolayer is a so-called self-assembled monolayer. Residues derived from an alkoxy monosilane compound are densely contained in the self-assembled monolayer and bind to each other through siloxane bonds. Therefore, the monolayer can firmly bind to the surface of an object to be treated. As a result, hydrophobicity can be expressed at a particularly high level.

The self-assembled monolayer can be formed using a trialkoxy monosilane compound and/or a dialkoxy monosilane compound as a silylating agent (A) as described above.

It is possible to confirm formation of the above-described monolayer, for example, by checking a change in film thickness or a change in a contact angle, or by X-ray photoelectron spectroscopy (XPS).

The film thickness of the above-described monolayer having hydrophobicity can be set to be less than or equal to 20 nm, preferably set to be less than or equal to 10 nm, more preferably set to be less than or equal to 5 nm, and still more preferably set to be less than or equal to 3 nm, for example. A lower limit value of the film thickness is not particularly limited as long as the effect of the present invention is not impaired, but is, for example, greater than or equal to 0.1 nm and typically greater than or equal to 0.5 nm.

Component (A2)

A component (A2) is a compound having a hydrophobic group binding to a silicon atom and a leaving group binding to a silicon atom. Examples of the component (A2) include compounds represented by General Formula (2).

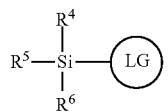

(2)

[In General Formula (2), $R^4$, $R^5$, and $R^6$ each independently represents a hydrogen atom, a nitrogen-containing group, or an organic group, and the total number of carbon atoms contained in $R^4$, $R^5$, and $R^6$ is greater than or equal to 1. LG represents a leaving group.]

The compounds represented by General Formula (2) can generate a chemical bond by reacting with a functional group (typically an —OH group, an —NH₂ group, or the like) on the surface of an object to be treated while eliminating a leaving group contained in the structure thereof. Examples of the leaving group include a halogen group or a nitrogen-containing group with a nitrogen atom that binds to a silicon atom in General Formula (2), a sulfoxy group or an acyloxy group, with an oxygen atom that binds to a silicon atom in General Formula (2) or derivatives thereof, a hydrogen atom, and an azide group.

More specifically, it is possible to use compounds represented by General Formulae (3) to (6) as the compound which has a substituent and is represented by General Formula (2).

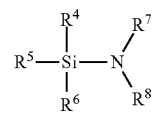

(3)

[In General Formula (3), $R^4$, $R^5$, and $R^6$ are the same as those in General Formula (2) and $R^7$ and $R^8$ each independently represents a hydrogen atom, an alkyl group, a cycloalkyl group, an acetyl group, or a heterocycloalkyl group. $R^7$ and $R^8$ may bind to each other to form a ring structure containing a nitrogen atom, and a ring-constituting atom constituting the ring structure may contain a heteroatom other than the nitrogen atom.]

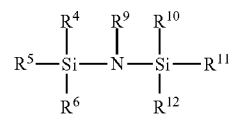

(4)

[In General Formula (4), $R^4$, $R^5$, and $R^6$ are the same as those in General Formula (2), $R^9$ represents a hydrogen atom, a methyl group, a trimethylsilyl group, or a dimethylsilyl group, $R^{10}$, $R^{11}$, and $R^{12}$ each independently represents a hydrogen atom or an organic group, and the total number of carbon atoms contained in $R^{10}$, $R^{11}$, and $R^{12}$ is greater than or equal to 1].

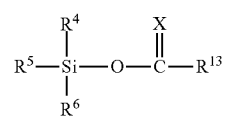

(5)

[In General Formula (5), $R^4$, $R^5$, and $R^6$ are the same as those in General Formula (2), X represents O, $CHR^{14}$, $CHOR^{14}$, $CR^{14}R^{14}$, or $NR^{15}$, $R^{13}$ and $R^{14}$ each independently represents a hydrogen atom, an alkyl group, a cycloalkyl group, a trialkylsilyl group, a trialkylsiloxy group, an alkoxy group, a phenyl group, a phenylethyl group, or an acetyl group, and $R^{15}$ represents a hydrogen atom, an alkyl group, or a trialkylsilyl group.]

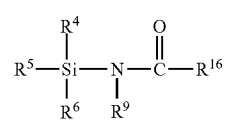

(6)

[In General Formula (6), $R^4$, $R^5$, and $R^6$ are the same as those in General Formula (2), $R^9$ is the same as that in General Formula (4), and $R^{16}$ represents a hydrogen atom, an alkyl group, or a trialkylsilylamino group.]

In the alkyl group and the cycloalkyl group in General Formulae (3) to (6), a part or all of hydrogen atoms binding to a carbon atom constituting the alkyl group and the cycloalkyl group may be substituted with a fluorine atom.

Examples of the compound represented by General Formula (3) include N,N-dimethylaminotrimethylsilane (TMSDMA), N,N-dimethylaminodimethylsilane, N,N-dimethylaminomonomethylsilane, N,N-diethylaminotrimethylsilane, t-butylaminotrimethylsilane, allylaminotrimethylsilane, trimethylsilylacetamide, N,N-dimethylaminodimethylvinylsilane, N,N-dimethylaminodimethylpropylsilane, N,N-dimethylaminodimethyloctylsilane, N,N-dimethylaminodimethylphenylethylsilane, N,N-dimethylaminodimethylphenylsilane, N,N-dimethylaminodimethyl-t-butylsilane, N,N-dimethylaminotriethylsilane, trimethylsilanamine, monomethylsilyl imidazole, dimethylsilyl imidazole, trimethylsilyl imidazole, monomethylsilyl triazole, dimethylsilyl triazole, trimethylsilyl triazole, N-(trimethylsilyl) dimethylamine, and trimethylsilyl morpholine.

Examples of the compound represented by General Formula (4) include hexamethyldisilazane (HMDS), N-methylhexamethyldisilazane, 1,1,3,3-tetramethyldisilazane, 1,3-dimethyldisilazane, 1,2-di-N-octyltetramethyldisilazane, 1,2-divinyltetramethyldisilazane, heptamethyldisilazane, nonamethyltrisilazane, tris(dimethylsilyl)amine, tris(trimethylsilyl)amine, pentamethylethyldisilazane, pentamethylvinyldisilazane, pentamethylpropyldisilazane, pentamethylphenylethyldisilazane, pentamethyl-t-butyldisilazane, pentamethylphenyldisilazane, and trimethyltriethyldisilazane.

Examples of the silylating agent represented by General Formula (5) include trimethylsilyl acetate, dimethylsilyl acetate, monomethylsilyl acetate, trimethylsilyl propionate, trimethylsilyl butyrate, and trimethylsilyloxy-3-penten-2-one.

Examples of the silylating agent represented by General Formula (6) include bis(trimethylsilyl) urea, N-trimethylsilylacetamide, and N-methyl-N-trimethylsilyltrifluoroacetamide.

In addition, among the compounds represented by General Formula (4), a compound having a hydrogen atom as $R^4$ and/or $R^{10}$ is also a preferred example.

In a case of using such a compound, it is considered that it is easy to form a network between molecules after the compound is developed on an object to be treated.

With such a contribution, once the compound binds to the surface of an object to be treated, there is a tendency that the compound is hardly removed even if it is subjected to a heating process.

In addition, among the compounds represented by General Formula (3), a silazane compound which has a nitrogen-containing group as $R^5$ and is represented by General Formula (3-a) and in which two nitrogen atoms bind to a silicon atom is preferably used.

In a case where such a compound is used, the two nitrogen atoms contained in the compound can respectively form chemical bonds with respect to functional groups on the surface of the object to be treated. That is, two bonds of one silicon atom can bind to the object to be treated, and thus, it is possible to form a firmer bond between the silylating agent (A) and the object to be treated.

Furthermore, in a case where it is possible to form a firm bond in this manner, once the silylating agent binds to the surface of an object to be treated, there is a tendency that the silylating agent is hardly removed even if it is subjected to a heating process.

In addition, as is defined below, $R^4$ and $R^6$ in General Formula (3-a) may be a nitrogen-containing group similarly to $R^5$ in General Formula (3), and an interaction between the silylating agent and the object to be treated may be enhanced depending on the application.

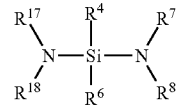

(3-a)

[In General Formula (3-a), $R^4$ and $R^6$ each independently represents a hydrogen atom, a nitrogen-containing group, or an organic group, and the total number of carbon atoms contained in $R^4$ and $R^6$ is greater than or equal to 1. $R^7$, $R^8$, $R^{17}$, and $R^{18}$ each independently represents a hydrogen atom, an alkyl group, a cycloalkyl group, an acetyl group, or a heterocycloalkyl group. $R^7$ and $R^8$ or $R^{17}$ and $R^{18}$ may bind to each other to form a ring structure containing a nitrogen atom, and atoms constituting the ring structure may include a heteroatom other than the nitrogen atom.]

In addition, in a case of paying attention to a substituent binding to a silicon atom, a silylating agent in which a so-called bulky substituent having a large number of carbon atoms binds to a silicon atom is preferably used. In a case where the surface treatment agent contains such a silylating agent, it is possible to increase the hydrophobicity of the surface of an object to be treated which has been treated with the surface treatment agent.

For this reason, the total number of carbon atoms contained in $R^4$, $R^5$, and $R^6$ in General Formula (2) is preferably greater than or equal to 3. Among these, from the viewpoint of obtaining sufficient reactivity in a silylation reaction, it is more preferable that any one of $R^4$, $R^5$, and $R^6$ in General Formula (2) be an organic group (hereinafter, referred to as a "specific organic group" in this paragraph) having 2 or more carbon atoms and the remaining two each independently represent a methyl group or an ethyl group. Examples of the specific organic group include an alkyl group having 2 to 20 carbon atoms which may be branched and/or may have a substituent, a vinyl group which may have a substituent, and an aryl group which may have a substituent. The number of carbon atoms of the specific organic group is more preferably 2 to 12, still more preferably 2 to 10, and particularly preferably 2 to 8.

From such a viewpoint, preferred examples of the above-described silylating agent which has a substituent and is represented by General Formula (2) include N,N-dimethylaminodimethylvinylsilane, N,N-dimethylaminodimethylpropylsilane, N,N-dimethylaminodimethyloctylsilane, N,N-dimethylaminodimethylphenylethylsilane, N,N-dimethylaminodimethylphenylsilane, N,N-dimethylaminodimethyl-t-butylsilane, N,N-dimethylaminotriethylsilane, and N,N-dimethylaminotrimethylsilane (TMSDMA).

Component (A3)

A component (A3) is a cyclic silazane compound.

Examples of the cyclic silazane compound include cyclic disilazane compounds such as 2,2,5,5-tetramethyl-2,5-disila-1-azacyclopentane and 2,2,6,6-tetramethyl-2,6-disila-1-azacyclohexane; cyclic trisilazane compounds such as 2,2,4,4,6,6-hexamethylcyclotrisilazane and 2,4,6-trimethyl-2,4,6-trivinylcyclotrisilazane; and cyclic tetrasilazane compounds such as 2,2,4,4,6,6,8,8-octamethylcyclotetrasilazane.

Among such cyclic silazane compounds, a compound having a partial structure in which two or more nitrogen-containing groups bind to one silicon atom can be suitably used. In this case, it is possible to form a firmer bond between a silylating agent and an object to be treated similarly to General Formula (3-a), and once the silylating agent binds to the object to be treated, there is a tendency that the silylating agent is hardly removed even if it is subjected to a heating process.

Other Silylating Agents

A silylating agent other than the above-described components (A1) to (A3) may be used as the component (A). Examples of other silylating agents include compounds represented by General Formula (7), (8), or (9).

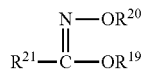

(7)

[In General Formula (7), $R^{19}$ and $R^{20}$ each independently represents a hydrogen atom, an alkyl group, or a trialkylsilyl group, at least one of $R^{19}$ and $R^{20}$ represents a trialkylsilyl group, and $R^{21}$ represents an aliphatic hydrocarbon group which has 1 to 10 carbon atoms in which a part or all of hydrogen atoms may be substituted with a fluorine atom.]

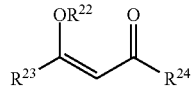

(8)

[In General Formula (8), $R^{22}$ represents a trialkylsilyl group and $R^{23}$ and $R^{24}$ each independently represents a hydrogen atom or an organic group.]

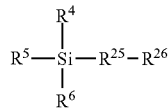

(9)

[In General Formula (9), $R^4$, $R^5$, and $R^6$ are the same as those in General Formula (2), $R^{25}$ represents a single bond or an organic group, and $R^{26}$ is not present or, if present, represents —$SiR^{27}R^{28}R^{29}$. $R^{27}$, $R^{28}$, and $R^{29}$ each independently represents a hydrogen atom, a nitrogen-containing group, or an organic group.]

Examples of the compounds represented by Formula (7) include bis(trimethylsilyl) trifluoroacetamide, trimethylsilylmethylacetamide, and bistrimethylsilylacetamide, and an example of the compounds represented by Formula (8) includes 2-trimethylsiloxy pent-2-en-4-one. Examples of the compound represented by Formula (9) include 1,2-bis(dimethylchlorosilyl) ethane and t-butyldimethylchlorosilane.

The silylating agents exemplified above may be used alone or in combination of two or more thereof as the component (A) contained in the surface treatment agent.

Among the above, as the component (A), the component (A2) is preferable, and the compounds represented by General Formula (3) and the compounds represented by General Formula (4) are more preferable from the viewpoint of ease of availability or good handleability.

The content of the component (A) contained in the surface treatment agent of the present embodiment is not particularly limited as long as the effect of the present invention is not impaired, but a lower limit value of the content of the component (A) with respect to the total amount of the surface treatment agent is preferably greater than or equal to 0.001 mass %, more preferably greater than or equal to 0.01 mass %, still more preferably greater than or equal to 0.1 mass %, particularly preferably greater than or equal to 0.5 mass %, and most preferably greater than or equal to 1.0 mass %.

In a case where the content of the component (A) is greater than or equal to the lower limit value, it is possible to further improve the water repellency of the surface of the object to be treated.

An upper limit value of the content of the component (A) in the above-described surface treatment agent is preferably less than or equal to 30 mass %, more preferably less than or equal to 15 mass %, and still more preferably less than or equal to 10 mass %.

In a case where the content of the component (A) is less than or equal to the upper limit value, it is easy to obtain a surface treatment agent having superior handleability.

Compound (C) Having Amide Skeleton in Molecule

A compound (C) (hereinafter, also referred to as a "component (C)") having an amide skeleton in a molecule is a component for maintaining the use stability of a surface treatment agent.

The component (C) in the present embodiment is not particularly limited, but it is possible to use any compounds well-known in the related art as long as the compounds have the amide skeleton in a molecule (provided that a compound corresponding to the component (A) is excluded).

Examples of the component (C) include compounds represented by General Formula (c1).

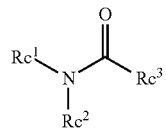

(c1)

[In the formula, $Rc^1$ and $Rc^2$ each independently represents a hydrogen atom or a hydrocarbon group which may have a substituent, and $Rc^3$ represents a hydrogen atom, a nitrogen-containing group, or an organic group.]

In General Formula (c1), $Rc^1$ and $Rc^2$ each independently represents a hydrogen atom or a hydrocarbon group which may have a substituent.

A hydrocarbon group represented by $Rc^1$ and $Rc^2$ preferably has 1 to 20 carbon atoms, and may be an aliphatic hydrocarbon group or an aromatic hydrocarbon group.

The aliphatic hydrocarbon group may be a saturated aliphatic hydrocarbon group or an unsaturated aliphatic hydrocarbon group. Examples of the aliphatic hydrocarbon group include a linear or branched aliphatic hydrocarbon group, and an aliphatic hydrocarbon group having a ring in the structure.

The linear aliphatic hydrocarbon group preferably has 1 to 10 carbon atoms, more preferably 1 to 5 carbon atoms, and still more preferably 1 to 3 carbon atoms. The branched aliphatic hydrocarbon group preferably has 3 to 10 carbon atoms, and more preferably 3 to 5 carbon atoms.

Specific examples of the linear or branched aliphatic hydrocarbon group include linear alkyl groups such as a methyl group, an ethyl group, an n-propyl group, an n-butyl group and an n-pentyl group; branched alkyl groups such as an isopropyl group, an isobutyl group, a tert-butyl group, an isopentyl group, a neopentyl group, a 1,1-diethylpropyl group, and a 2,2-dimethylbutyl group; linear alkenyl groups such as a vinyl group, a propenyl group (allyl group), and a 2-butenyl group; branched alkenyl groups such as a 1-methylvinyl group, a 2-methylvinyl group, a 1-methylpropenyl group, and a 2-methylpropenyl group; linear alkynyl groups such as an ethynyl group, a propargyl group, and a 3-pentynyl group; and branched alkynyl groups such as a 1-methyl propargyl group.

The linear or branched aliphatic hydrocarbon group represented by $Rc^1$ and $Rc^2$ may or may not have a substituent. Examples of the substituent include a hydroxy group, a carbonyl group, an alkoxy group, and a halogen atom.

As the aliphatic hydrocarbon group containing a ring in the structure, represented by $Rc^1$ and $Rc^2$, an alicyclic hydrocarbon group (a group in which one hydrogen atom is removed from an aliphatic hydrocarbon ring) and a group in which one hydrogen atom of an aliphatic hydrocarbon ring is substituted with an alkylene group are mentioned. The number of carbon atoms of the alkylene group is preferably 1 to 4. The aliphatic hydrocarbon ring preferably has 3 to 10 carbon atoms, and more preferably has 3 to 6 carbon atoms.

The aliphatic hydrocarbon ring may be a polycyclic ring or a monocyclic ring.

A monocyclic aliphatic hydrocarbon ring preferably has 3 to 6 carbon atoms, and specific examples thereof include cyclopropane, cyclobutane, cyclopentane, and cyclohexane.

A polycyclic aliphatic hydrocarbon ring preferably has 7 to 10 carbon atoms, and specific examples thereof include polycycloalkanes having a bridged ring-based polycyclic skeleton, such as adamantane, norbornane, and isobornane.

A cyclic aliphatic hydrocarbon group represented by $Rc^1$ and $Rc^2$ may or may not have a substituent. Examples of the substituent include a hydroxy group, a carbonyl group, an alkoxy group, a halogen atom, an alkyl group, an alkenyl group, and an alkynyl group. The alkyl group, the alkenyl group, and the alkynyl group in the substituents preferably have 1 to 5 carbon atoms, and more preferably have 1 to 3 carbon atoms.

In a case where the hydrocarbon group represented by $Rc^1$ and $Rc^2$ is an aromatic hydrocarbon group, the aromatic hydrocarbon group is a hydrocarbon group having at least one aromatic ring. The aromatic ring is not particularly limited as long as the ring is a cyclic conjugated system having 4n+2 π electrons, and may be monocyclic or polycyclic. The number of carbon atoms of the aromatic ring is preferably 5 to 20, more preferably 5 to 18, and still more preferably 6 or 16.

Specific examples of the aromatic ring include aromatic hydrocarbon rings such as benzene, naphthalene, anthracene, phenanthrene, and pyrene; and an aromatic heterocycle in which a part of carbon atoms constituting the aromatic hydrocarbon ring is substituted with a heteroatom. Examples of the heteroatom in the aromatic heterocycle include an oxygen atom, a sulfur atom, and a nitrogen atom. Specific examples of the aromatic heterocycle include a pyrrolidine ring, a pyridine ring, and a thiophene ring.

Specific examples of the aromatic hydrocarbon group represented by $Rc^1$ and $Rc^2$ include a group in which one hydrogen atom is removed from the aromatic hydrocarbon ring or the aromatic heterocycle (aryl group or heteroaryl group); a group in which one hydrogen atom is removed from an aromatic compound containing two or more aromatic rings (for example, biphenyl, fluorene, and the like); and a group in which one hydrogen atom of the aromatic hydrocarbon ring or the aromatic heterocycle is substituted with an alkylene group (for example, arylalkyl groups such as a benzyl group, a phenethyl group, a 1-naphthylmethyl group, a 2-naphthylmethyl group, a 1-naphthylethyl group, and a 2-naphthylethyl group). The number of carbon atoms of the alkylene group binding to the aromatic hydrocarbon ring or the aromatic heterocycle is preferably 1 to 4, more preferably 1 to 2, and particularly preferably 1.

The aromatic hydrocarbon group represented by $Rc^1$ and $Rc^2$ may or may not have a substituent. Examples of the substituent include a hydroxy group, a carbonyl group, an alkoxy group, a halogen atom, an alkyl group, an alkenyl group, and an alkynyl group. The alkyl group, the alkenyl group, and the alkynyl group in the substituents preferably have 1 to 5 carbon atoms, and more preferably have 1 to 3 carbon atoms.

Among these, the hydrocarbon group represented by $Rc^1$ and $Rc^2$ is preferably an aliphatic hydrocarbon group, more preferably an alkyl group, and still more preferably an alkyl group having 1 to 5 carbon atoms.

$Rc^1$ and $Rc^2$ each independently is preferably a hydrogen atom or an alkyl group having 1 to 5 carbon atoms, more preferably a hydrogen atom or an alkyl group having 1 to 3 carbon atoms, still more preferably a methyl group or an ethyl group, and particularly preferably a methyl group.

In General Formula (c1), $Rc^3$ represents a hydrogen atom, a nitrogen-containing group, or an organic group.

The organic group represented by $Rc^3$ preferably has 1 to 20 carbon atoms. Examples of the organic group include a hydrocarbon group which may have a substituent, and a group represented by General Formula (rc3-1).

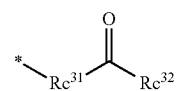

(rc3-1)

[In the formula, $Rc^{31}$ represents an alkylene group, and $Rc^{32}$ represents a hydrogen atom or a hydrocarbon group which may have a substituent. * represents a bond binding to the carbon atom of the carbonyl group in General Formula (c1).]

Examples of the hydrocarbon group which may have a substituent in $Rc^3$ include the same groups as those exemplified as the hydrocarbon group which may have a substituent in $Rc^1$ and $Rc^2$.

Among these, as the hydrocarbon group in $Rc^3$, an aliphatic hydrocarbon group is preferable, and a linear or branched aliphatic hydrocarbon group is more preferable. Specific examples of the linear or branched aliphatic hydrocarbon group include the same groups as those exemplified in $Rc^1$ and $Rc^2$. As the linear or branched aliphatic hydrocarbon group in $Rc^3$, an alkyl group having 1 to 5 carbon atoms or an alkenyl group having 2 to 5 carbon atoms is preferable, and an alkyl group having 1 to 3 carbon atoms or an alkenyl group having 2 or 3 carbon atoms is more preferable.

In General Formula (rc3-1), $Rc^{31}$ represents an alkylene group. The alkylene group represented by $Rc^{31}$ may be linear or branched. The number of carbon atoms of the linear alkylene group is preferably 1 to 5, and more preferably 1 to 3. The number of carbon atoms of the branched alkylene group is preferably 2 to 5, and more preferably 2 or 3. Among these, $Rc^{31}$ is preferably an ethylene group or a methylene group, and more preferably a methylene group.

In General Formula (rc3-1), $Rc^{32}$ represents a hydrogen atom or a hydrocarbon group which may have a substituent. Examples of the hydrocarbon group which may have a substituent include the same groups as those exemplified as the hydrocarbon group which may have a substituent in $Rc^1$ and $Rc^2$.

Among these, as the hydrocarbon group represented by $Rc^{32}$, an aliphatic hydrocarbon group is preferable, and a linear or branched aliphatic hydrocarbon group is more preferable. Specific examples of the linear or branched aliphatic hydrocarbon group include the same groups as those exemplified in $Rc^1$ and $Rc^2$. The linear or branched aliphatic hydrocarbon group represented by $Rc^3$ is preferably an alkyl group having 1 to 5 carbon atoms, and more preferably an alkyl group having 1 to 3 carbon atoms.

$Rc^{32}$ is preferably a hydrogen atom or an alkyl group having 1 to 5 carbon atoms, more preferably a hydrogen atom or an alkyl group having 1 to 3 carbon atoms, still more preferably a methyl group or an ethyl group, and particularly preferably a methyl group.

An example of the nitrogen-containing group represented by $Rc^3$ typically includes a group represented by General Formula (rc3-2).

(rc3-2)

[In the formula, $Rc^{33}$ and $Rc^{34}$ each independently represents a hydrogen atom or a hydrocarbon group which may have a substituent. $Rc^{33}$ and $Rc^{34}$ may bind to each other to form a ring structure containing a nitrogen atom, and atoms constituting the ring structure may include a heteroatom other than the nitrogen atom. * represents a bond binding to the carbon atom of the carbonyl group in General Formula (c1).]

In General Formula (rc3-2), $Rc^{33}$ and $Rc^{34}$ each independently represents a hydrogen atom or a hydrocarbon group which may have a substituent. Examples of the hydrocarbon group which may have a substituent include the same groups as those exemplified as the hydrocarbon group which may have a substituent in $Rc^1$ and $Rc^2$. Among these, as the hydrocarbon group represented by $Rc^{33}$ and $Rc^{34}$, an aliphatic hydrocarbon group is preferable, and a linear or branched aliphatic hydrocarbon group is more preferable. Specific examples of the linear or branched aliphatic hydrocarbon group include the same groups as those exemplified in $Rc^1$ and $Rc^2$. As the linear or branched aliphatic hydrocarbon group represented by $Rc^{33}$ and $Rc^{34}$, an alkyl group having 1 to 5 carbon atoms is preferable, and an alkyl group having 1 to 3 carbon atoms is more preferable.

$Rc^{33}$ and $Rc^{34}$ are preferably a hydrogen atom or an alkyl group having 1 to 5 carbon atoms, more preferably a hydrogen atom or an alkyl group having 1 to 3 carbon atoms, still more preferably a methyl group or an ethyl group, and particularly preferably a methyl group.

Specific examples of the component (C) include formamides such as formamide, N-methylformamide, N,N-dimethylformamide, and N,N-diethylformamide; acetamides such as acetamide, N-methylacetamide, N,N-dimethylacetamide, N,N-diethylacetamide, and N,N-dimethylacetoacetamide; propionamides such as N-methylpropionamide, N,N-dimethylpropionamide, N,N,2-trimethylpropionamide, N-ethyl-N,2-dimethylpropionamide, N,N-diethyl-2-methylpropionamide, N,N,2-trimethyl-2-hydroxypropionamide, N-ethyl-N,2-dimethyl-2-hydroxypropionamide, and N,N-diethyl-2-hydroxy-2-methylpropionamide; acrylamides such as acrylamide, N-methyl acrylamide, N,N-dimethyl acrylamide, and N,N-diethyl acrylamide; and ureas such as N,N,N',N'-tetramethylurea, and N,N,N',N'-tetraethyl urea.

The component (C) is preferably a compound represented by General Formula (c1). $Rc^3$ in General Formula (c1) is preferably a hydrocarbon group which may have a substituent, a group represented by General Formula (rc3-1), or a group represented by General Formula (rc3-2), and more preferably a group represented by General Formula (rc3-2).

The component (C) may be used alone or in combination of two or more thereof.

The content of the component (C) contained in the surface treatment agent of the present embodiment is not particularly limited as long as the effect of the present invention is not impaired, but a lower limit value of the content of the component (C) with respect to the total amount of the surface treatment agent is preferably greater than or equal to 0.001 mass %, more preferably greater than or equal to 0.01 mass %, still more preferably greater than or equal to 0.1 mass %, particularly preferably greater than or equal to 0.5 mass %, and most preferably greater than or equal to 1.0 mass %.

In a case where the content of the component (C) is greater than or equal to the preferred lower limit value, the quality of the surface treatment agent can be maintained more stably.

An upper limit value of the content of the component (C) in the surface treatment agent of the present embodiment is not particularly limited, but in a case where the component (C) is generally used as a solvent (for example, formamides, acetamides, propionamides, ureas), the upper limit value can be set to be less than or equal to 99.9 mass %. In this case, the content of the component (C) is preferably less than or equal to 99 mass %, more preferably less than or equal to 98 mass %, and still more preferably less than or equal to 96 mass %.

In a case where the surface treatment agent of the present embodiment contains a component (S) described later, the upper limit value of the content of the component (C) is preferably less than or equal to 20 mass %, more preferably less than or equal to 15 mass %, still more preferably less than or equal to 10 mass %, and particularly preferably less than or equal to 8 mass %.

In a case where the content of the component (C) is less than or equal to the preferred upper limit value, the balance with other components can be easily achieved.

Optional Components

The surface treatment agent of the present embodiment may contain optional components in addition to the above-described component (A) and component (C). Examples of the optional components include a solvent (S), a nitrogen-containing basic compound or a salt thereof (B), a surfactant or an anti-foaming agent which does not correspond to the above-described silylating agent (A), and water.

Solvent (S)

The surface treatment agent of the present embodiment preferably contains a solvent (S) (hereinafter, also referred to as a "component (S)"). The component (S) is used for dissolving and mixing respective components to form a homogeneous solution. The component (S) may be any one as long as the component can dissolve and mix respective components, and components generally used as a solvent for the surface treatment agent can be used without particular limitation (provided that a component corresponding to the component (C) is excluded).

Examples of the component (S) include linear saturated aliphatic hydrocarbons such as n-hexane, n-heptane, n-octane, n-nonane, n-decane, n-undecane, n-dodecane, n-tridecane, n-tetradecane, n-pentadecane, n-hexadecane, n-heptadecane, n-octadecane, n-nonadecane, and n-icosane; branched saturated aliphatic hydrocarbons such as 2-methylpentane, 3-methylpentane, 2,2-dimethylbutane, 2,3-dimethylbutane, 2-methylhexane, 3-methylhexane, 2,3-dimethylpentane, 2,4-dimethylpentane, 2,2,3-trimethylpentane, 2,2,4-trimethylpentane, 3,4-diethylhexane, 2,6-dimethyloctane, 3,3-dimethyloctane, 3,5-dimethyloctane, 4,4-dimethyloctane, 3-ethyl-3-methylheptane, 2-methylnonane, 3-methylnonane, 4-methylnonane, 5-methylnonane, 2-methylundecane, 3-methylundecane, 2,2,4,6,6-pentamethylheptane, and 2,2,4,4,6,8,8-heptamethylnonane; cyclic saturated aliphatic hydrocarbons such as decalin, cyclohexane, methylcyclohexane, ethylcyclohexane, 1,2-dimethylcyclohexane, 1,3-dimethylcyclohexane, 1,4-dimethylcyclohexane, propylcyclohexane, isopropylcyclohexane, 1,2-methylethylcyclohexane, 1,3-methylethylcyclohexane, 1,4-methylethylcyclohexane, 1,2,3-trimethylcyclohexane, 1,2,4-trimethylcyclohexane, and 1,3,5-trimethylcyclohexane; sulfoxides such as dimethyl sulfoxide; sulfones such as dimethyl sulfone, diethyl sulfone, bis(2-hydroxyethyl) sulfone, and tetramethylene sulfone; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; other ethers such as dimethylglycol, dimethyldiglycol, dimethyltriglycol, methylethyl diglycol, diethylglycol, diethylene glycol dimethyl ether, diethylene glycol methyl ethyl ether, diethylene glycol diethyl ether, triethylene glycol dimethyl ether, tetraethylene glycol dimethyl ether, and propylene glycol monomethyl ether; (poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, and propylene glycol monoethyl ether acetate; other esters such as methyl 2-hydroxypropionate, ethyl 2-hydroxypropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl acetate, n-hexyl acetate, n-heptyl acetate, n-octyl acetate, n-pentyl formate, isopentyl acetate, n-butyl propionate, ethyl butyrate, n-propyl butyrate, isopropyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, propylene glycol diacetate, and propylene carbonate; ketones such as methyl ethyl ketone, cyclohexanone, 2-heptanone, and 3-heptanone; lactones such as β-propiolactone, γ-butyrolactone, and δ-valerolactone; aromatic hydrocarbons such as benzene, toluene, xylene, 1,3,5-trimethylbenzene, and naphthalene; terpenes such as p-menthane, diphenylmenthane, limonene, terpinene, bornane, norbornane, and pinane; and the like.

The component (S) may be used alone or in combination of two or more thereof.

In a case where the surface treatment agent of the present embodiment contains the component (S), the content of the component (S) with respect to the total amount of the surface treatment agent is preferably 50 to 99.9 mass %, more preferably 70 to 98 mass %, and still more preferably 80 to 96 mass %.

Nitrogen-Containing Basic Compound or Salt Thereof (B)

The surface treatment agent of the present embodiment preferably further contains a nitrogen-containing basic compound or a salt thereof (B) (hereinafter, also referred to as a "component (B)") in addition to the above-described component (A) and component (C).

Here, the nitrogen-containing basic compound is a compound containing a nitrogen atom that can act as a base (provided that a compound corresponding to the component (A) or the component (C) is excluded).

Typical examples of the component (B) include a compound having a nitrogen-containing heterocyclic structure or a salt thereof (B1) (hereinafter, also referred to as a "component (B1)"), a compound represented by General Formula (B-2) or a salt thereof (B2) (hereinafter, also referred to as a "component (B2)"), and an amine compound having a phenoxy group or a salt thereof (B3) (hereinafter, also referred to as a "component (B3)").

Nitrogen-Containing Heterocyclic Compound or Salt Thereof (B1)

In a case where the surface treatment agent of the present embodiment further contains the component (B1), a silylation reaction with respect to an object to be treated due to the silylating agent (A) is promoted by a catalytic action of the component (B1). As a result, in a case where the surface treatment time is the same as that in a case where the surface treatment agent does not contain the component (B1), it is possible to impart water repellency to the surface of the object to be treated at a higher level. In a case where the water repellency is imparted to the same degree as in a case where the surface treatment agent does not contain the component (B1), it is possible to shorten the surface treatment time of the object to be treated.

The component (B1) is not particularly limited as long as the component is a compound containing a nitrogen atom in a ring structure, or a salt thereof. The component (B1) may contain a heteroatom other than a nitrogen atom, such as an oxygen atom and a sulfur atom, in a ring structure.

Examples of a salt of a nitrogen-containing heterocyclic compound include a salt of an inorganic acid (such as hydrochloric acid, sulfuric acid, and nitric acid) of a nitrogen-containing heterocyclic compound, and a halogen salt.

The component (B1) is preferably an aromatic nitrogen-containing heterocyclic compound or a salt thereof. In a case where the component (B1) contains an aromatic nitrogen-containing heterocyclic compound or a salt thereof, it is possible to further improve the water repellency of the surface of an object to be treated which has been treated with a surface treatment agent.

In addition, in a case where the aromatic nitrogen-containing heterocyclic compound or a salt thereof is used as the component (B1) in this manner, an aspect in which an unshared electron pair having a nitrogen atom constituting a heterocycle is oriented outside a ring of an aromatic ring is preferable. By doing this, the component (B1) can appropriately act on a silylating agent (A), and thus, the effect of the present invention can be stably brought about.

The component (B1) may be a compound in which a plurality of rings bind to each other through a single bond or a polyvalent linking group; or a salt thereof. In this case, the plurality of rings binding through a linking group may contain at least one nitrogen-containing heterocycle.

Among the polyvalent linking groups, a divalent linking group is preferable from the viewpoint of small steric hindrance between the rings. Specific examples of the divalent linking group include an alkylene group having 1 to 6 carbon atoms, —CO—, —CS—, —O—, —S—, —NH—, —N=N—, —CO—O—, —CO—NH—, —CO—S—, —CS—O—, —CS—S—, —CO—NH—CO—, —NH—CO—NH—, —SO—, and —SO$_2$—.

The number of rings contained in a compound in which the plurality of rings bind to each other through a polyvalent linking group is preferably less than or equal to 4, more preferably less than or equal to 3, and still more preferably 2 from the viewpoint of easy preparation of a uniform surface treatment agent. For example, the number of rings in a case of fused rings such as a naphthalene ring is set to 2.

The component (B1) may be a compound or a salt thereof in which a plurality of rings are condensed. In this case, at least one ring among rings constituting a fused ring may be a nitrogen-containing heterocycle.

The number of rings contained in the component (B1) in which a plurality of rings are condensed is preferably less than or equal to 4, more preferably less than or equal to 3, and still more preferably 2 from the viewpoint of easy preparation of a uniform surface treatment agent.

The component (B 1) preferably contains a nitrogen-containing 5-membered ring or a fused polycyclic ring including a nitrogen-containing 5-membered ring skeleton.

Suitable examples of a nitrogen-containing heterocyclic compound include pyridine, pyridazine, pyrazine, pyrimidine, triazine, tetrazine, pyrrole, pyrazole, imidazole, triazole, tetrazole, oxazole, isoxazole, thiazole, isothiazole, oxadiazole, thiadiazole, quinoline, isoquinoline, cinnoline, phthalazine, quinoxaline, quinazoline, indole, indazole, benzimidazole, benzotriazole, benzoxazole, benzisoxazole, benzothiazole, benzisothiazole, benzoxadiazole, benzothiadiazole, saccharin, pyrrolidine, and piperidine.

Among these, pyrrole, pyrazole, imidazole, triazole, tetrazole, oxazole, isoxazole, thiazole, isothiazole, oxadiazole, thiadiazole, indole, indazole, benzimidazole, benzotriazole, benzoxazole, benzisoxazole, benzothiazole, benzisothiazole, benzoxadiazole, benzothiadiazole, and saccharin are preferable and pyrrole, imidazole, triazole, tetrazole, and benzotriazole are more preferable.

Examples of a salt of a nitrogen-containing heterocyclic compound include hydrochlorides of the above-described compounds.

The above-described nitrogen-containing heterocyclic compound having a substituent or a salt thereof is also preferably used as the component (B1).

Examples of the substituent which the nitrogen-containing heterocyclic compound or a salt thereof may have include an alkyl group, a cycloalkyl group, an alkoxy group, a cycloalkyloxy group, an aryl group, an aralkyl group, a halogenated alkyl group, an aliphatic acyl group, a halogenated aliphatic acyl group, an arylcarbonyl group, a carboxyalkyl group, a halogen atom, a hydroxyl group, a mercapto group, an alkylthio group, an amino group, a monoalkylamino group containing an alkyl group, a dialkylamino group containing an alkyl group, a nitro group, and a cyano group.

The nitrogen-containing heterocyclic compound or a salt thereof may have a plurality of substituents on a nitrogen-containing heterocycle. In a case where the number of substituents is plural, the plurality of substituents may be the same as or different from each other.

In a case where the substituents contain an aliphatic hydrocarbon ring, an aromatic hydrocarbon ring, or the like, the rings may further have the same substituents as those which the nitrogen-containing heterocyclic compound or a salt thereof may have.

The number of carbon atoms of an alkyl group as a substituent is preferably 1 to 6, more preferably 1 to 4, and still more preferably 1 or 2. Specific examples of the alkyl group having 1 to 6 carbon atoms include a methyl group, an ethyl group, an n-propyl group, an isopropyl group, an n-butyl group, an isobutyl group, a sec-butyl group, a tert-butyl group, an n-pentyl group, and an n-hexyl group. Among these, a methyl group and an ethyl group are preferable, and a methyl group is more preferable.

The number of carbon atoms of a cycloalkyl group as a substituent is preferably 3 to 8, more preferably 3 to 7, and still more preferably 4 to 6. Specific examples of the cycloalkyl group having 3 to 8 carbon atoms include a cyclopropyl group, a cyclobutyl group, a cyclopentyl group, a cyclohexyl group, a cycloheptyl group, and a cyclooctyl group.

The number of carbon atoms of an alkoxy group as a substituent is preferably 1 to 6, more preferably 1 to 4, and still more preferably 1 or 2. Specific examples of the alkoxy group having 1 to 6 carbon atoms include a methoxy group, an ethoxy group, an n-propyloxy group, an isopropyloxy group, an n-butyloxy group, an isobutyloxy group, a sec-butyloxy group, a tert-butyloxy group, an n-pentyloxy group, and an n-hexyloxy group. Among these, a methoxy group and an ethoxy group are preferable, and a methoxy group is more preferable.

The number of carbon atoms of a cycloalkyloxy group as a substituent is preferably 3 to 8, more preferably 3 to 7, and still more preferably 4 to 6. Specific examples of the cycloalkyloxy group having 3 to 8 carbon atoms include a cyclopropyloxy group, a cyclobutyloxy group, a cyclopentyloxy group, a cyclohexyloxy group, a cycloheptyloxy group, and a cyclooctyloxy group.

The number of carbon atoms of an aryl group as a substituent is preferably 6 to 20, and more preferably 6 to 12. Specific examples of the aryl group having 6 to 20 carbon atoms include a phenyl group, an α-naphthyl group, a β-naphthyl group, a biphenyl-4-yl group, a biphenyl-3-yl group, a biphenyl-2-yl group, an anthracen-1-yl group, an anthracen-2-yl group, an anthracen-9-yl group, a phenanthren-1-yl group, a phenanthren-2-yl group, a phenanthren-3-yl group, a phenanthren-4-yl group, and a phenanthren-9-yl group.

Among these, a phenyl group, an α-naphthyl group, a β-naphthyl group, a biphenyl-4-yl group, a biphenyl-3-yl group, and a biphenyl-2-yl group are preferable, and a phenyl group is more preferable.

The number of carbon atoms of an aralkyl group as a substituent is preferably 7 to 20, and more preferably 7 to 12. Specific examples of the aralkyl group having 7 to 20 carbon atoms include a benzyl group, a phenethyl group, a 3-phenyl-n-propyl group, a 4-phenyl-n-butyl group, an α-naphthylmethyl group, a β-naphthylmethyl group, a 2-(α-naphthyl)ethyl group, and a 2-(β-naphthyl)ethyl group. Among these groups, a benzyl group and a phenethyl group are preferable, and a benzyl group is more preferable.

Examples of a halogen atom contained in a halogenated alkyl group as a substituent include a fluorine atom, a chlorine atom, a bromine atom, and an iodine atom. The number of carbon atoms of a halogenated alkyl group as a substituent is preferably 1 to 6, more preferably 1 to 4, and still more preferably 1 or 2.

Specific examples of the halogenated alkyl group having 1 to 6 carbon atoms include a chloromethyl group, a dichloromethyl group, a trichloromethyl group, a fluoromethyl group, a difluoromethyl group, a trifluoromethyl group, a 1,1-difluoroethyl group, a 2,2,2-trifluoroethyl group, and a pentafluoroethyl group.

The number of carbon atoms of an aliphatic acyl group as a substituent is preferably 2 to 7, more preferably 2 to 5, and still more preferably 2 or 3. Specific examples of the aliphatic acyl group having 2 to 7 carbon atoms include an acetyl group, a propionyl group, a butanoyl group, a pentanoyl group, a hexanoyl group, and a heptanoyl group. Among these, an acetyl group and a propionyl group are preferable, and an acetyl group is more preferable.

Examples of a halogen atom contained in a halogenated aliphatic acyl group as a substituent include a fluorine atom, a chlorine atom, a bromine atom, and an iodine atom. The number of carbon atoms of a halogenated aliphatic acyl group as a substituent is preferably 2 to 7, more preferably 2 to 5, and still more preferably 1 or 2. Specific examples of the halogenated aliphatic acyl group having 2 to 7 carbon atoms include a chloroacetyl group, a dichloroacetyl group, a trichloroacetyl group, a fluoroacetyl group, a difluoroacetyl group, a trifluoroacetyl group, and a pentafluoropropionyl group.

The number of carbon atoms of an arylcarbonyl group as a substituent is preferably 7 to 20, and more preferably 7 to 13. Specific examples of the arylcarbonyl group having 7 to 20 carbon atoms include a benzoyl group, an α-naphthoyl group, and a β-naphthoyl group.

The number of carbon atoms of a carboxyalkyl group as a substituent is preferably 2 to 7, more preferably 2 to 5, and still more preferably 2 or 3. Specific examples of the carboxyalkyl group having 2 to 7 carbon atoms include a carboxymethyl group, a 2-carboxyethyl group, a 3-carboxy-n-propyl group, a 4-carboxy-n-butyl group, a 5-carboxy-n-pentyl group, and a 6-carboxy-n-hexyl group. Among these, a carboxymethyl group is preferable.

Examples of a halogen atom include a fluorine atom, a chlorine atom, a bromine atom, and an iodine atom.

Among these, a fluorine atom, a chlorine atom, and a bromine atom are preferable, and a chlorine atom and a bromine atom are more preferable.

The number of carbon atoms of an alkylthio group as a substituent is preferably 1 to 6, more preferably 1 to 4, and still more preferably 1 or 2. Specific examples of the alkylthio group having 1 to 6 carbon atoms include a methylthio group, an ethylthio group, an n-propylthio group, an isopropylthio group, an n-butylthio group, an isobutylthio group, a sec-butylthio group, a tert-butylthio group, an n-pentylthio group, and an n-hexylthio group. Among these, a methylthio group and an ethylthio group are preferable, and a methylthio group is more preferable.

Specific examples of an alkyl group contained in a monoalkylamino group containing an alkyl group or a dialkylamino group containing an alkyl group are the same as those of an alkyl group as the above-described substituent.

An ethylamino group and a methylamino group are preferable, and a methylamino group is more preferable as the monoalkylamino group containing an alkyl group.

A diethylamino group and a dimethylamino group are preferable, and a dimethylamino group is more preferable as the dialkylamino group.

Among the above, pyrrole, imidazole, triazole, tetrazole which may have an alkyl group or an aryl group, and benzotriazole are more preferable as the component (B1). Suitable specific examples of the component (B1) include compounds represented by the following formulae.

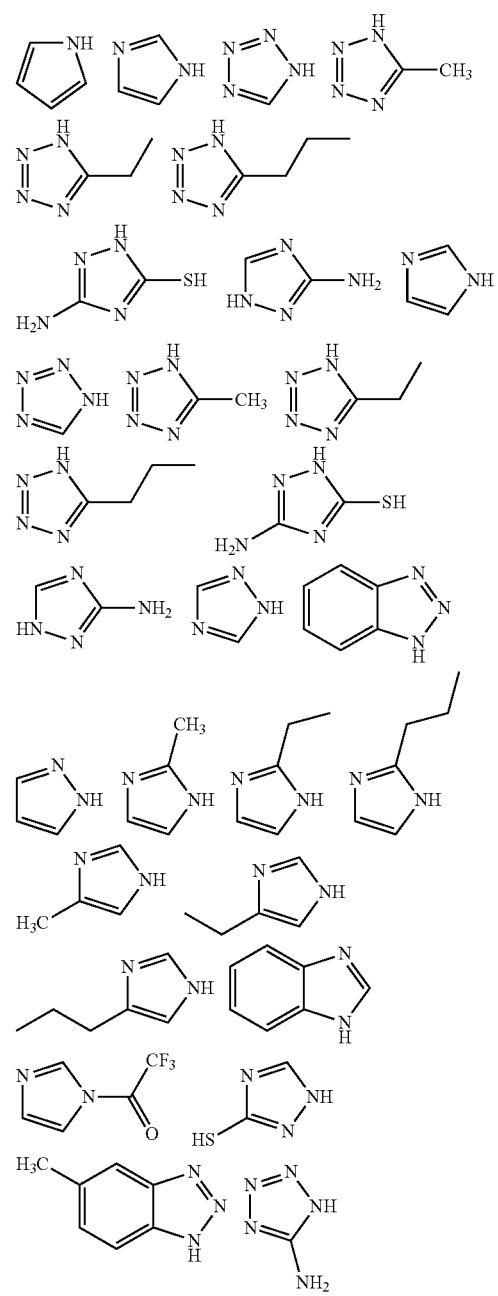

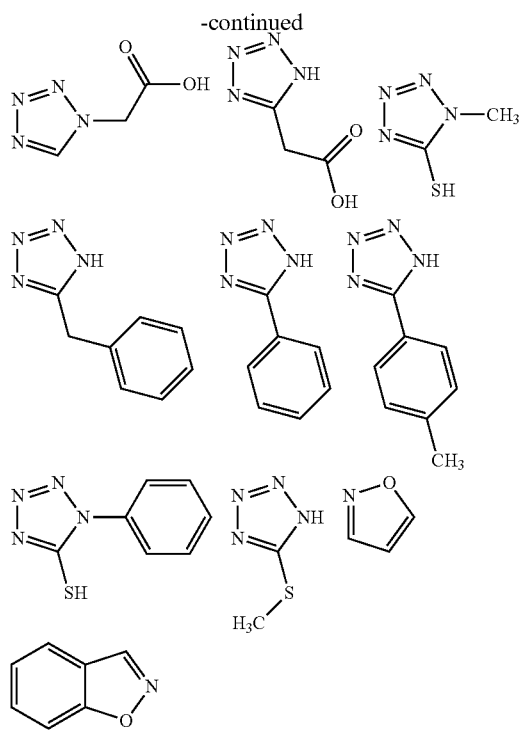

The component (B1) may be used alone or in combination of two or more thereof.

Compound Represented by General Formula (B-2) or Salt Thereof (B2)

The surface treatment agent of the present embodiment may contain a compound represented by General Formula (B-2) or a salt thereof (B2).

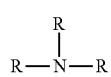
(B-2)

[In Formula (B-2), R's each independently represents a hydrogen atom, a hydroxyl group, or an organic group.]

Examples of the organic group represented by R in Formula (B-2) include an alkyl group which may have a substituent, a cycloalkyl group which may have a substituent, an aryl group which may have a substituent, or an aralkyl group which may have a substituent. Examples of the substituents include a hydroxy group, a carboxy group, an amino group, a halogen atom (such as a fluorine atom, a chlorine atom, and a bromine atom), and an alkoxy group.

The alkyl group as the organic group represented by R in Formula (B-2) may be linear or branched. The linear or branched alkyl group is preferably a linear or branched alkyl group having 1 to 40 carbon atoms, and more preferably a linear or branched alkyl group having 6 to 20 carbon atoms.

The number of carbon atoms of the cycloalkyl group as the organic group represented by R in Formula (B-2) is preferably 3 to 20, and more preferably 5 to 15.

The number of carbon atoms of the aryl group as the organic group represented by R in Formula (B-2) is preferably 6 to 20, and more preferably 6 to 10. Specific examples thereof include a phenyl group and a naphthyl group.

The number of carbon atoms of the aralkyl group as the organic group represented by R in Formula (B-2) is preferably 7 to 20, and more preferably 7 to 11. A specific example thereof includes a benzyl group.

In addition, the component (B2) may be a salt of a compound represented by General Formula (B-2).

Examples of a salt of the compound include an inorganic acid (such as hydrochloric acid, sulfuric acid, and nitric acid) salt, a halogen salt, and a hydroxide salt.

Specific examples of the compound represented by General Formula (B-2) include ammonia; hydroxylamine; primary amines such as ethylamine, n-propylamine, n-butylamine, 1-ethylbutylamine, 1,3-diaminopropane, and cyclohexylamine; secondary amines such as diethylamine, di-n-propylamine, di-n-butylamine, 4,4'-diaminodiphenylamine, diethylenetriamine, tetraethylenepentamine, and N-(2-aminoethyl) ethanolamine; tertiary amines such as dimethylethylamine, diethylmethylamine, triethylamine, tributylamine, triisopropylamine, and dicyclohexylmethylamine; aromatic amines such as N,N-dibutylaniline, N,N-dihexylaniline, 2,6-diisopropylaniline, and 2,4,6-tri(t-butyl) aniline; and alkanolamines such as monoethanolamine, diethanolamine, triethanolamine, diethylethanolamine, and propanolamine.

Specific examples of the salt of the compound represented by General Formula (B-2) include hydrochlorides of the above-described compounds.

The component (B2) may be used alone or in combination of two or more thereof.

Amine Compound Having Phenoxy Group or Salt Thereof (B3)

The component (B3) is a compound containing a phenoxy group at a terminal opposite to a nitrogen atom of an alkyl group contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, and an aryloxy group.

The component (B3) more preferably has at least one oxyalkylene chain between a phenoxy group and a nitrogen atom. The number of oxyalkylene chains in one molecule is preferably 3 to 9, and more preferably 4 to 6. Among the oxyalkylene chains, —CH$_2$CH$_2$O— is particularly preferable.

A specific example thereof includes 2-[2-{2-(2,2-dimethoxy-phenoxyethoxy) ethyl}-bis-(2-methoxy ethyl)]-amine.

An amine compound having a phenoxy group can be obtained, for example, through extraction using an organic solvent such as ethyl acetate and chloroform after heating a primary or secondary amine having a phenoxy group and haloalkyl ether for a reaction and adding an aqueous solution of strong bases such as sodium hydroxide, potassium hydroxide, and tetraalkylammonium thereto. In addition, an amine compound having a phenoxy group can also be obtained through extraction using an organic solvent such as ethyl acetate and chloroform after heating a primary or secondary amine and haloalkyl ether having a phenoxy group at a terminal for a reaction and adding an aqueous solution of strong bases such as sodium hydroxide, potassium hydroxide, and tetraalkylammonium thereto.

The component (B3) may be used alone or in combination of two or more thereof.

Other nitrogen-containing basic compounds may be used as the component (B) in the surface treatment agent of the present embodiment. Examples of the other nitrogen-containing basic compounds include a guanidine compound or a salt thereof.

The component (B1) among the above is preferably contained as the component (B) in the surface treatment agent of the present embodiment.

In a case where the surface treatment agent of the present embodiment contains the component (B), the content of the component (B) with respect to the total amount of the surface treatment agent is preferably 0.001 to 20 mass %, more preferably 0.01 to 10 mass %, still more preferably 0.03 to 5 mass %, and particularly preferably 0.05 to 3 mass %.

In a case where the content of the component (B) is greater than or equal to the preferred lower limit value, it is possible to further improve the water repellency of the surface of the object to be treated.

In a case where the content of the component (B) is less than or equal to the preferred upper limit value, the balance with other components can be easily achieved.

In a case where the surface treatment agent contains the component (B), precipitates may be generated depending on the kind of the component (B) (for example, the component (B1) and the like). However, since the surface treatment agent of the present embodiment contains the component (C), the generation of precipitates can be suppressed. Therefore, preferred examples of the surface treatment agent of the present embodiment include an agent containing the component (A), the component (C), and the component (B); and an agent containing the component (A), the component (C), the component (B), and the component (S).

According to the above-described surface treatment agent of the present embodiment, the use stability of the surface treatment agent is improved since the component (C) is contained. Therefore, even in a case where the surface treatment agent contains an additive such as the component (B), the generation of precipitates can be suppressed and good quality can be maintained.

Surface Treatment Method

The surface treatment method according to the present embodiment is a surface treatment method in which surface treatment of an object to be treated is performed using the above-described surface treatment agent.

The surface treatment method according to the present embodiment is a method for imparting water repellency (silylation) to the surface of an object to be treated. Representative examples of a purpose of the surface treatment include: (1) imparting water repellency to the surface of a substrate as an object to be treated to improve adhesiveness between a resin pattern, which is made of photoresist, and the substrate; and (2) imparting water repellency to the surface of an inorganic pattern included in an object to be treated to prevent pattern collapse during washing.

Examples of a method for applying a surface treatment agent to the surface of an object to be treated include a spray method, a spin coating method, and an immersion method. The surface treatment time is not particularly limited, but is, for example, 1 to 60 seconds. After the surface treatment, the contact angle of water on the surface of the object to be treated is preferably 40° to 120°, and more preferably 60° to 100°.

A device used for the surface treatment of an object to be treated is not particularly limited as long as the device can apply a surface treatment agent onto the object to be treated. An example of the device includes a device that can apply a surface treatment agent to the object to be treated through a spray method, a spin coating method, an immersion method, and the like.

An example of an object to be treated to be subjected to surface treatment includes a substrate used for manufacturing a semiconductor device. In addition, examples of the surface of an object to be treated include the surface of a substrate itself, the surface of an inorganic pattern provided on a substrate, and the surface of an unpatterned inorganic layer.

An example of an inorganic pattern provided on a substrate includes an inorganic pattern formed by producing an etching mask on the surface of an inorganic layer present on the substrate through a photoresist method and then performing etching treatment. Examples of the inorganic layer include a substrate itself, a layer made of an oxide of an element constituting a substrate and a layer made of an inorganic substance, such as silicon nitride, titanium nitride, or tungsten, formed on the surface of a substrate. Such an inorganic layer is not particularly limited, but an example thereof includes an inorganic layer formed in the process of manufacturing a semiconductor device.

According to the above-described surface treatment method of the present embodiment, since the surface treatment of an object to be treated is performed using the surface treatment agent of the above-described embodiment, it is possible to impart water repellency (silylation) to the surface of the object to be treated at a high level while suppressing the remaining of impurities (precipitates) or the like.

Optional Step

The surface treatment method according to the present embodiment may include steps such as a washing step, a rinsing step, and a drying step.

Washing Step

The washing step is a step of previously washing the surface of an object to be treated.

The washing method is not particularly limited, but an example of the method for washing a semiconductor substrate includes a well-known RCA washing method. In the RCA washing method, first, a semiconductor substrate is immersed in an SC-1 solution of hydrogen peroxide and ammonium hydroxide to remove fine particles and an organic substance from the semiconductor substrate. Subsequently, the semiconductor substrate is immersed in a hydrofluoric acid aqueous solution to remove a natural oxide film on the surface of the substrate. Thereafter, the semiconductor substrate is immersed in an acidic solution of an SC-2 solution of hydrogen peroxide and diluted hydrochloric acid to remove alkali ions or metal impurities which are insoluble in the SC-1 solution.

Rinsing Step

The rinsing step is a step of rinsing the surface of a water-repellent (silylated) object to be treated with a rinsing liquid.

In the rinsing step, the surface of a water-repellent (silylated) object to be treated is rinsed with a rinsing liquid to be described below. The rinsing method is not particularly limited, and a method generally used for washing a substrate in a semiconductor manufacturing step can be employed.

Examples of such a method include a method for immersing an object to be treated in a rinsing liquid, a method for bringing steam of a rinsing liquid into contact with an object to be treated, and a method for supplying a rinsing liquid to an object to be treated while spinning the object to be treated. Among these, the method for supplying a rinsing liquid to an object to be treated while spinning the object to be treated is preferable as the rinsing method. In the method, the rotational speed of the spinning is, for example, 100 rpm to 5,000 rpm.

Rinsing Liquid

The rinsing liquid used in the rinsing step is not particularly limited, and a liquid generally used in a step of rinsing a semiconductor substrate can be used. An example of the rinsing liquid includes a liquid containing an organic solvent. Examples of the organic solvent include hydrocarbons, esters, ethers, ketones, halogen-containing solvents, sulfoxide-based solvents, alcohols, derivatives of polyhydric alcohol, and nitrogen-containing compound solvents.

The rinsing liquid may contain water instead of or together with the organic solvent.

The rinsing liquid may contain a well-known additive and the like. Examples of the well-known additive include a fluorine-based surfactant and a silicone-based surfactant.

Specific examples of the fluorine-based surfactant include commercially available fluorine-based surfactants such as BM-1000 and BM-1100 (all are manufactured by BM Chemie), MEGAFACE F142D, MEGAFACE F172, MEGAFACE F173, and MEGAFACE F183 (all are manufactured by DIC CORPORATION), FLUORAD FC-135, FLUORAD FC-170C, FLUORAD FC-430, and FLUORAD FC-431 (all are manufactured by Sumitomo 3M Limited), SURFLON S-112, SURFLON S-113, SURFLON S-131, SURFLON S-141, and SURFLON S-145 (all are manufactured by Asahi Glass Co., Ltd.), and SH-28PA, SH-190, SH-193, SZ-6032, and SF-8428 (all are manufactured by Toray Silicone Co., Ltd.), but are not limited thereto.

Specifically, it is possible to preferably use an unmodified silicone-based surfactant, a polyether-modified silicone-based surfactant, a polyester-modified silicone-based surfactant, an alkyl-modified silicone-based surfactant, an aralkyl-modified silicone-based surfactant, a reactive silicone-based surfactant, and the like as the silicone-based surfactant.

A commercially available silicone-based surfactant can be used as the silicone-based surfactant. Specific examples of the commercially available silicone-based surfactant include PAINTAD M (manufactured by Dow Corning Toray Co., Ltd.), TOPEKA K1000, TOPEKA K2000, and TOPEKA K5000 (all are manufactured by Takachiho Industrial Co. Ltd.), XL-121 (polyether-modified silicone-based surfactant, manufactured by Clariant), and BYK-310 (polyester-modified silicone-based surfactant, manufactured by BYK Chemie).

Drying Step

The drying step is a step of drying an object to be treated. It is possible to efficiently remove a rinsing liquid remaining on an object to be treated after the rinsing step by performing the drying step.

The method for drying an object to be treated is not particularly limited, and well-known methods such as spin drying, heat drying, warm air drying, and vacuum drying can be used. A suitable example thereof includes spin drying under blowing of inert gas (such as nitrogen gas).

EXAMPLES

Hereinafter, the present invention will be described in more detail using Examples, but is not limited to these examples.

Preparation of Surface Treatment Agent

Examples 1 to 6 and Comparative Example 1

A surface treatment agent of each example was prepared by mixing respective components shown in Table 1 with each other.

TABLE 1

| | Component (A) | Component (C) | Component (B) | Component (S) | |
|---|---|---|---|---|---|
| Example 1 | (A)-1 [10.0] | (C)-1 [5.5] | (B)-1 [0.5] | (S)-1 [45.0] | (S)-2 [39.0] |
| Example 2 | (A)-1 [10.0] | (C)-2 [5.5] | (B)-1 [0.5] | (S)-1 [45.0] | (S)-2 [39.0] |
| Example 3 | (A)-1 [10.0] | (C)-3 [5.5] | (B)-1 [0.5] | (S)-1 [45.0] | (S)-2 [39.0] |
| Example 4 | (A)-1 [10.0] | (C)-4 [5.5] | (B)-1 [0.5] | (S)-1 [45.0] | (S)-2 [39.0] |
| Example 5 | (A)-1 [10.0] | (C)-5 [5.5] | (B)-1 [0.5] | (S)-1 [45.0] | (S)-2 [39.0] |
| Example 6 | (A)-1 [8.0] | (C)-3 [2.0] | (B)-1 [0.5] | (S)-1 [34.5] | (S)-2 [55.0] |
| Comparative Example 1 | (A)-1 [10.0] | — | (B)-1 [0.5] | (S)-1 [50.5] | (S)-2 [39.0] |

In Table 1, each abbreviation has the following meaning. The numerical values in parentheses represent formulation amount (mass %).

(A)-1: Hexamethyldisilazane (HMDS)
(C)-1: N,N-dimethylacetamide
(C)-2: N,N-dimethylacetoacetamide
(C)-3: N,N,N',N'-tetramethyl urea
(C)-4: N,N-dimethylpropionamide
(C)-5: N,N-dimethyl acrylamide
(B)-1: 5-benzyl-1H-tetrazole
(S)-1: Propylene glycol monomethyl ether acetate
(S)-2: Propylene carbonate Evaluation of Quality The surface treatment agents shown in Examples 1 to 6 and Comparative Example 1 were prepared, the presence or absence of precipitates in each of the surface treatment agents was visually checked, and evaluation was performed according to the following evaluation criteria. The results are shown in Table 2.

Evaluation Criteria
A: Without precipitates
B: With precipitates

Surface Treatment Method of Object to be Treated

A silicon nitride substrate (SiN) was used as an object to be treated. The silicon nitride substrate was fragmented to manufacture a chip for measurement, which was then immersed in a hydrofluoric acid aqueous solution with a concentration of 1 mass % for 1 minute at 25° C. Subsequently, the chip was washed with pure water for 1 minute.

The washed chip was dried in a nitrogen stream, and the dried chip was subjected to SC1 treatment. Subsequently, the SC1-treated chip was washed with pure water for 1 minute. Subsequently, the chip washed with water was dried in a nitrogen stream.

The surface of the dried chip was immersed in each surface treatment agent shown in Examples 1 to 6 and Comparative Example 1 for 20 seconds at room temperature for surface treatment. Thereafter, the surface-treated chip was immersed in isopropyl alcohol for 1 minute at room temperature and finally dried in a nitrogen stream.

Evaluation of Contact Angle

Pure water droplets (2.04) were added dropwise onto the surface of an object to be treated of which the surface was treated through the above-described <Surface Treatment Method of Object to be Treated> and the contact angle was measured 10 seconds after the dropwise addition. The measurement results of the contact angle are shown in Table 2. As a result of measuring a contact angle of each object to be treated before the surface treatment in the same manner, the contact angle was 14.0° in all cases.

TABLE 2

|  | Quality | Contact angle (°) |
| --- | --- | --- |
| Example 1 | A | 64.6 |
| Example 2 | A | 64.0 |
| Example 3 | A | 63.6 |
| Example 4 | A | 63.5 |
| Example 5 | A | 64.0 |
| Example 6 | A | 65.6 |
| Comparative Example 1 | B | — |

As can be seen from Table 2, in the surface treatment agents of Examples 1 to 6, no precipitates were observed, and the water repellent performance was also good. On the other hand, in the surface treatment agent of Comparative Example 1, precipitates were observed.

From the above, according to the surface treatment agents of the Examples to which the present invention is applied, it can be confirmed that the surface of the object to be treated can be water-repellent (silylated) at a high level while maintaining good quality.

What is claimed is:

1. A surface treatment agent, comprising:
   a silylating agent (A) represented by General Formula (4);
   a compound (C) represented by General Formula (c1);
   a nitrogen-containing basic compound or a salt thereof (B), provided that a compound corresponding to the compound (C) is excluded; and
   a solvent (S), provided that a compound corresponding to the compound (C) is excluded, wherein the content of the compound (C) with respect to the total amount of the surface treatment agent is greater than or equal to 0.1 mass % and less than or equal to 20 mass %,
   the content of the solvent (S) with respect to the total amount of the surface treatment agent is greater than or equal to 70 mass % and less than or equal to 98 mass %,
   wherein the nitrogen-containing basic compound is an aromatic nitrogen-containing heterocyclic compound containing a nitrogen-containing 5-membered ring,

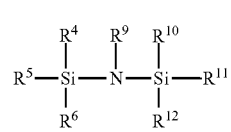

(4)

wherein $R^4$, $R^5$, and $R^6$ each independently represents a hydrogen atom, a nitrogen-containing group, or an organic group, and the total number of carbon atoms contained in $R^4$, $R^5$, and $R^6$ is greater than or equal to 1, $R^9$ represents a hydrogen atom, a methyl group, a trimethylsilyl group, or a dimethylsilyl group, $R^{10}$, $R^{11}$, and $R^{12}$ each independently represents a hydrogen atom or an organic group, and the total number of carbon atoms contained in $R^{10}$, $R^{11}$, and $R^{12}$ is greater than or equal to 1;

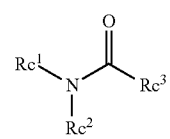

(c1)

and $Rc^1$ and $Rc^2$ each independently represents a hydrogen atom or a hydrocarbon group which may have a substituent, and $Rc^3$ represents a hydrogen atom, a nitrogen-containing group, or an organic group.

2. A surface treatment method, comprising subjecting an object to be treated to surface treatment using the surface treatment agent according to claim 1.

* * * * *